(12) United States Patent
Dulle et al.

(10) Patent No.: US 11,196,133 B2
(45) Date of Patent: Dec. 7, 2021

(54) SOLID-STATE RELAY DEDICATED RECIRCULATION PATH SYSTEMS AND METHODS

(71) Applicant: CPS Technology Holdings LLC, New York, NY (US)

(72) Inventors: Ronald J. Dulle, Mequon, WI (US); Michael R. Blemberg, Shorewood, WI (US); Kevin P. Minnickel, Milwaukee, WI (US); Charles S. Tosch, Port Washington, WI (US)

(73) Assignee: CPS Technology Holdings LLC, New York, NY (US)

( * ) Notice: Subject to any disclaimer, the term of this patent is extended or adjusted under 35 U.S.C. 154(b) by 0 days.

(21) Appl. No.: 16/669,174

(22) Filed: Oct. 30, 2019

(65) Prior Publication Data

US 2020/0136123 A1 Apr. 30, 2020

Related U.S. Application Data

(60) Provisional application No. 62/752,792, filed on Oct. 30, 2018.

(51) Int. Cl.
| | |
|---|---|
| *B60L 1/00* | (2006.01) |
| *B60L 3/00* | (2019.01) |
| *H02G 3/00* | (2006.01) |
| *H01M 50/572* | (2021.01) |
| *H03K 17/687* | (2006.01) |
| *B60L 50/50* | (2019.01) |

(52) U.S. Cl.
CPC .......... *H01M 50/572* (2021.01); *B60L 50/50* (2019.02); *H03K 17/687* (2013.01); *H01M 2220/20* (2013.01)

(58) Field of Classification Search
CPC .. H01M 2/34; H01M 2220/20; H01M 50/572; H03K 17/687; H03K 17/795; B60L 50/50; Y02E 60/10; Y02T 10/70
USPC ........................................................ 307/10.1
See application file for complete search history.

(56) References Cited

U.S. PATENT DOCUMENTS

| | | | | |
|---|---|---|---|---|
| 8,803,486 B2* | 8/2014 | Norimatsu | .......... | H02M 7/5375 320/166 |
| 9,054,582 B2* | 6/2015 | Beuss | .................... | H02M 3/158 |
| 2005/0073282 A1* | 4/2005 | Carrier | ...................... | B25F 5/00 320/106 |
| 2015/0084422 A1* | 3/2015 | Ishigaki | .................. | H01F 27/38 307/43 |

* cited by examiner

*Primary Examiner* — Richard Tan
(74) *Attorney, Agent, or Firm* — Boardman & Clark LLP (57) ABSTRACT

Disclosed is a battery system comprising a solid-state relay assembly comprising a device-side driver circuitry having a device-side switching device, a battery-side driver circuitry having a battery-side switching device, a first recirculation driver circuitry, a first recirculation switching device, a second recirculation switching device, and a second recirculation driver circuitry.

9 Claims, 7 Drawing Sheets

SOLID-STATE RELAY DEDICATED RECIRCULATION PATH SYSTEMS AND METHODS

CROSS-REFERENCE TO RELATED APPLICATIONS

This application claims priority to U.S. Provisional Patent Application No. 62/752,792 entitled "Solid-State Relay Dedicated Recirculation Path Systems and Method," filed Oct. 30, 2018.

FIELD

The present disclosure generally relates to battery systems and, more particularly, to solid-state relays that may be coupled to or implemented in a battery system.

BACKGROUND

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

An automotive vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as but not limited to 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) may disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine.

Further, a micro-hybrid electric vehicle (mHEV) also may use a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs may not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled.

In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead-acid battery. In fact, xEVs may produce fewer undesirable emission products and may exhibit greater fuel efficiency as compared to traditional internal combustion vehicles. For example, some xEVs may utilize regenerative braking to generate and store electrical energy as the xEV decelerates or coasts. More specifically, as the xEV reduces in speed, a regenerative braking system may convert mechanical energy into electrical energy, which may then be stored and/or used to power to the xEV.

As technology continues to evolve, there is a need to provide improved power sources, particularly battery modules, for such vehicles. Further, there is a need to provide improved connections between the power sources and vehicle. As a non-limiting example, there is a need to ensure power irregularities do not damage electronic components.

SUMMARY

Certain embodiments commensurate in scope with the disclosed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

Disclosed is a solid-state relay system which may address certain deficiencies outlined above. Generally, a solid-state relay may be controlled to selectively operate in a connected (e.g., closed) state, which enables current flow therethrough, and a disconnected (e.g., open) state, which blocks current flow therethrough. Thus, in some embodiments, a solid-state-relay assembly may be electrically coupled between a battery and one or more electrical devices (e.g., an electrical system) to facilitate controlling current flow therebetween and, thus, charging and/or discharging of the battery.

The disclosed solid state relay system may advantageously allow for a recirculation path. The recirculation path may advantageously route excess energy away from electronics in an irregular event. For example, the disclosed recirculation path may advantageously protect components in a reverse polarity event.

Disclosed is a battery system comprising: a battery; a solid-state relay system; and a control system; wherein the solid-state relay system comprises a first battery-side switching device, first device-side switching device, and a recirculation path. Further disclosed is a battery system wherein the solid-state relay system further comprises a second battery-side switching device and third battery-side switching device, a second device-side switching device and third device-side switching device. Further disclosed is a battery system wherein the recirculation path comprises a first recirculation switching device. Further disclosed is a battery system wherein the recirculation path further comprises a second recirculation switching device. Further disclosed is a battery system wherein the first recirculation switching device comprises a metal-oxide-semiconductor field-effect transistor. Further disclosed is a battery system wherein both the first recirculation switching device and the second recirculation switching device each comprise a metal-oxide-semiconductor field-effect transistor. Further disclosed is a battery system wherein the first recirculation switching device connects to a first recirculation driver circuitry and the second recirculation device connects to a second recirculation driver circuitry. Further disclosed is a battery system wherein each of the first battery-side switching device, second battery-side switching device, third battery-side switching device, first device-side switching device, second device-side switching device and third device-side switching device each comprise a metal-oxide semiconductor field-effect transistor.

Disclosed is a solid-state relay assembly for a battery system comprising: a device-side driver circuitry having a device-side switching device; a battery-side driver circuitry having a battery-side switching device; a first recirculation driver circuitry; a first recirculation switching device; a second recirculation switching device; and a second recirculation driver circuitry. Further disclosed is a solid-state relay assembly wherein the first recirculation switching device, second recirculation switching device, or both the first recirculation switching device and second recirculation switching device comprise a metal-oxide semiconductor field-effect transistor. Further disclosed is a solid-state relay assembly wherein the device-side switching device comprises a first, second, and third device-side switching device. Further disclosed is a solid-state relay assembly wherein the battery-side switching device comprises a first, second, and third battery-side switching device. Further disclosed is a solid-state relay assembly wherein the device-side switching device is a metal-oxide semiconductor field-effect transistor. Further disclosed is a solid-state relay assembly wherein the battery-side switching device is a metal-oxide semiconductor field-effect transistor.

These and other features and advantages of devices, systems, and methods according to this invention are described in, or are apparent from, the following detailed descriptions of various examples of embodiments.

BRIEF DESCRIPTION OF DRAWINGS

Various examples of embodiments of the systems, devices, and methods according to this invention will be described in detail, with reference to the following figures, wherein.

It should be understood that the drawings are not necessarily to scale. In certain instances, details that are not necessary to the understanding of the invention or render other details difficult to perceive may have been omitted. It should be understood, of course, that the invention is not necessarily limited to the particular embodiments illustrated herein.

DETAILED DESCRIPTION

One or more specific embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
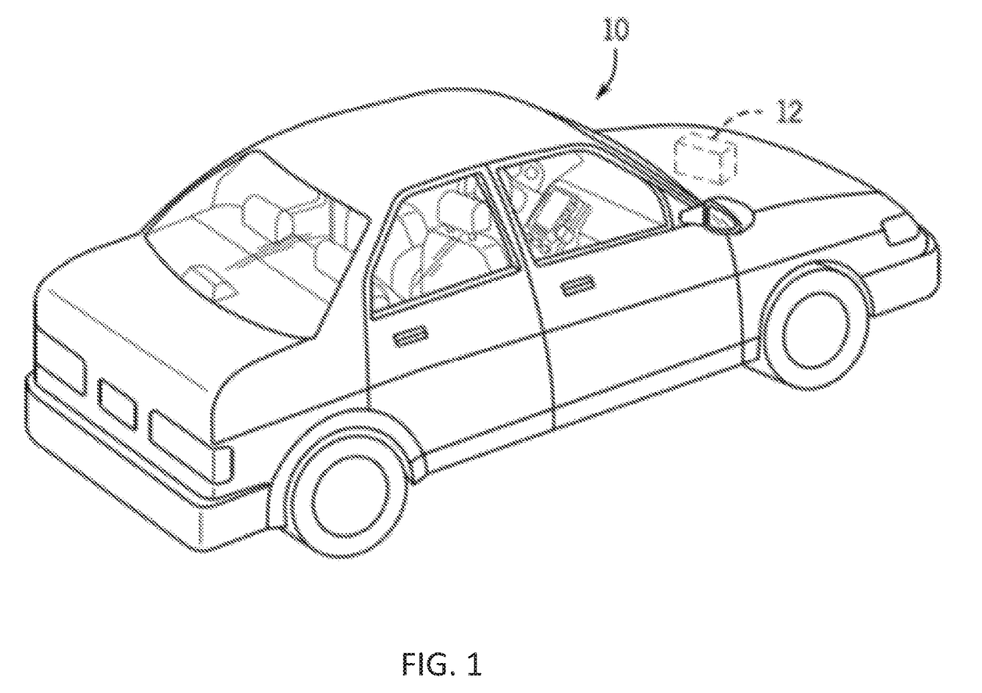
FIG. 1 is a perspective view of a vehicle, in accordance with various embodiments.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
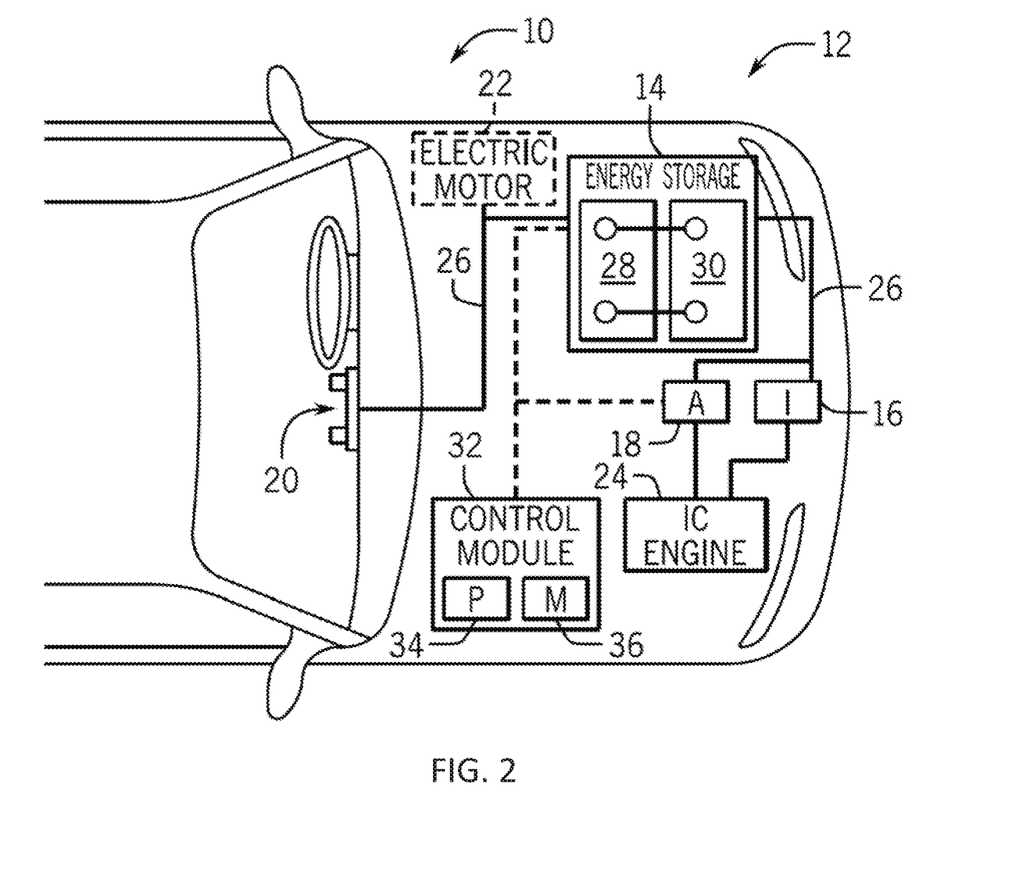
FIG. 2 is a schematic view of a battery system in the vehicle of FIG. 1, in accordance with various embodiments.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator 18 and/or the electric motor 22 are generally referred to herein as a regenerative braking system.

To facilitate capturing and supplying electric energy, the energy storage component 18 may be electrically coupled to the vehicle's electric system via a bus 26. For example, the bus 26 may enable the energy storage component 14 to receive electrical energy generated by the alternator 18 and/or the electric motor 24. Additionally, the bus 26 may enable the energy storage component 14 to output electrical energy to the ignition system 16 and/or the vehicle console 20. Accordingly, when a 12 volt battery system is used, the bus 26 may carry electrical power typically between 8-18 volts.

Additionally, as depicted, the energy storage component 14 may include multiple battery modules. For example, in the depicted embodiment, the energy storage component 13 includes a lithium ion (e.g., a first) battery module 28 and a lead-acid (e.g., a second) battery module 30, which each includes one or more battery cells. In other embodiments, the energy storage component 14 may include any number of battery modules. Additionally, although the lithium ion battery module 28 and lead-acid battery module 30 are depicted adjacent to one another, they may be positioned in different areas around the vehicle. For example, the lead-acid battery module 30 may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, when the lithium ion battery module 28 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32. More specifically, the control module 32 may control operations of components in the battery system 12, such as relays (e.g., switches) within energy storage component 14, the alternator 18, and/or the electric motor 22. For example, the control module 32 may regulate amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, control voltage output by the alternator 18 and/or the electric motor 22, and the like.

Accordingly, the control unit 32 may include one or more processor 34 and one or more memory 36. More specifically, the one or more processor 34 may include one or more application specific integrated circuits (ASICs), one or more field programmable gate arrays (FPGAs), one or more general purpose processors, or any combination thereof. Additionally, the one or more memory 36 may include volatile memory, such as random access memory (RAM), and/or non-volatile memory, such as read-only memory (ROM), optical drives, hard disc drives, or solid-state drives. In some embodiments, the control unit 32 may include portions of a vehicle control unit (VCU) and/or a separate battery control module.

Figure 3:
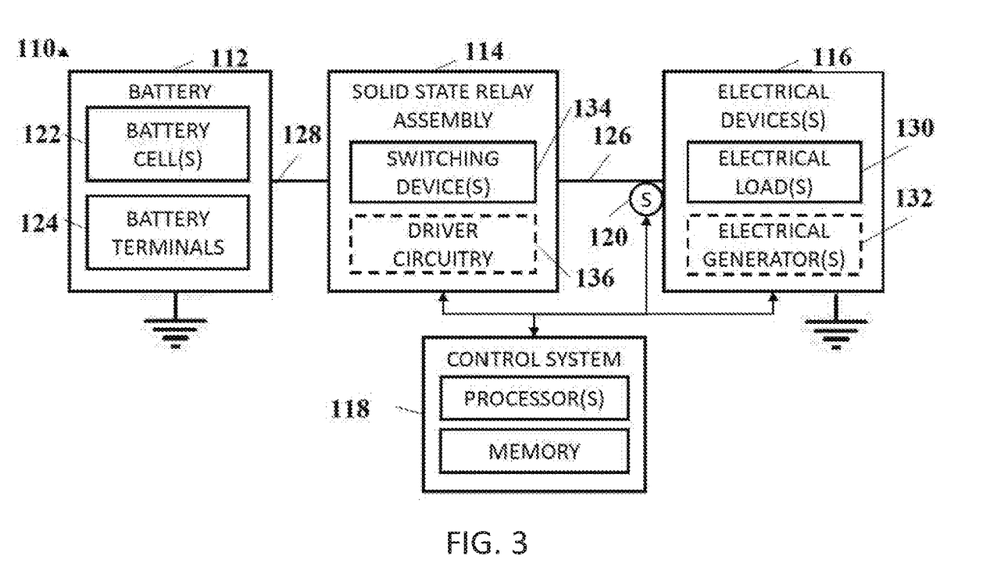
FIG. 3 is a detail view of a battery system according to various embodiments.

To help further illustrate, an example of a battery system 110 including a battery 112, a solid-state relay assembly 114, one or more electrical devices 116, and a control system 118 is shown in FIG. 3. As in the depicted example, a battery 112 may include battery terminals 124 and one or more battery cells 122. In some embodiments, the battery cells 122 may be electrically coupled (e.g., in series and/or parallel) between the battery terminals 124 to enable the battery 112 to provide a target storage capacity, exhibit a target internal resistance, and/or operate in a target voltage domain (e.g., range). For example, the battery cells 122 may be electrically coupled between the battery terminals 124 to enable the battery 112 to operate in a 1V voltage domain, a 12V voltage domain, a 48V voltage domain, a 100V voltage domain, a 1000V voltage domain, or the like. In other words, the battery 112 may be a 1V battery, a 12V battery, a 48V battery, a 100V battery, a 1000V battery, or the like.

Additionally, in some embodiments, the battery 112 may include a battery pack or a battery module. In other words, in such embodiments, the battery 112 may include a housing that encloses the battery cells 122 and/or on which the battery terminals 124 are implemented. In any case, a battery cell 122 may generally operate to store received electrical power as electrical energy and/or to output electrical power using stored electrical energy.

Furthermore, as in the depicted example, the electrical devices 116 may include one or more electrical loads 130 that operate using received electrical power. In some embodiments, the electrical devices 116 may additionally or alternatively include one or more electrical generators 132, which operate to output electrical power. For example, an electrical generator 132 may include an alternator that outputs electrical power using mechanical energy received from an internal combustion engine or another mechanical energy source.

Moreover, as in the depicted example, the solid-state relay assembly 114 may be electrically coupled between the battery cells 122 and the electrical devices 116. In some embodiments, the control system 118 may generally control operation of the battery system 110 and, thus, may be communicatively coupled to the solid-state relay assembly 114. In other words, the control system 118 may output control signals (e.g., commands) instructing the solid-state relay assembly 114 to switch from a first (e.g., connected) state to a second (e.g., disconnected or different connected) state or vice versa. Additionally or alternatively, the control system 118 may output control signals instructing the solid-state relay assembly 114 to maintain the first state and/or the second state.

In some embodiments, the control system 118 may be implemented at least in part in a battery management unit (BMU) and/or a vehicle control unit (VCU). In some embodiments, the solid-state relay assembly may be integrated within the BMU or separate therefrom. Additionally, in some embodiments, the control system 118 may control operation of the battery system 110 based at least in part on operational parameters (e.g., sensor data) measured by one or more sensors 120. For example, when operational parameters (e.g., voltage and/or current) of the battery system 110 are indicative of a short-circuit condition being present, the control system 118 may instruct (e.g., via a control signal) the solid-state relay assembly 114 to switch from a connected state to the disconnected state, thereby electrically disconnecting the battery 112 from the electrical devices 116.

In some embodiments, the solid-state relay assembly 114 may be implemented external to the battery 112, for example, such that the solid-state relay assembly 14 is external from the housing of the battery 112. Thus, in such embodiments, the solid-state relay assembly 114 may be electrically coupled to a (e.g., positive) battery terminal 124 of the battery 112. For example, the solid-state relay assembly 114 may be electrically coupled to the battery 112 via one or more battery-side electrical busses 128. Alternatively, the solid-state relay assembly 114 may be directly coupled to a battery terminal 124 of the battery 112, thereby obviating the battery-side electrical busses 128.

In other embodiments, the solid-state relay assembly 114 may be implemented within the housing of the battery 112. In other words, in such embodiments, the solid-state relay assembly 114 may be electrically coupled between the battery cells 122 and the battery terminal 124 of the battery 112. In any case, as in the depicted example, the solid-state relay assembly 114 may be electrically coupled to the electrical devices 116 via one or more device-side electrical busses 126.

Thus, as in the depicted example, the solid-state relay assembly 114 may be electrically coupled between the battery cells 122 and the electrical devices 116 to facilitate controlling flow of electrical power therebetween. For example, in a connected state, the solid-state relay assembly 114 may enable electrical power to flow from a battery cell 122 to an electrical load 130, thereby discharging the battery cell 122 to power the electrical load 130, and/or enable electrical power to flow from an electrical generator 132 to the battery cell 122, thereby charging the battery cell 122. On the other hand, in a disconnected state, the solid-state relay assembly 114 may block electrical power from flowing between a battery cell 122 and the electrical devices 116, thereby blocking charging and/or discharging of the battery cell 122.

To facilitate controlling flow of electrical power, as in the depicted example, the solid-state relay assembly 114 may include one or more switching devices 134. In some embodiments, the solid-state relay assembly 114 additionally include driver circuitry 136 coupled to a switching device 134, for example, which facilitates controlling operation (e.g., switching) of the switching device 134 based at least in part on a control signal received from the control system 118. Thus, in such embodiments, the driver circuitry 136 may be coupled between the control system 118 and the switching device 134.

Figure 4:
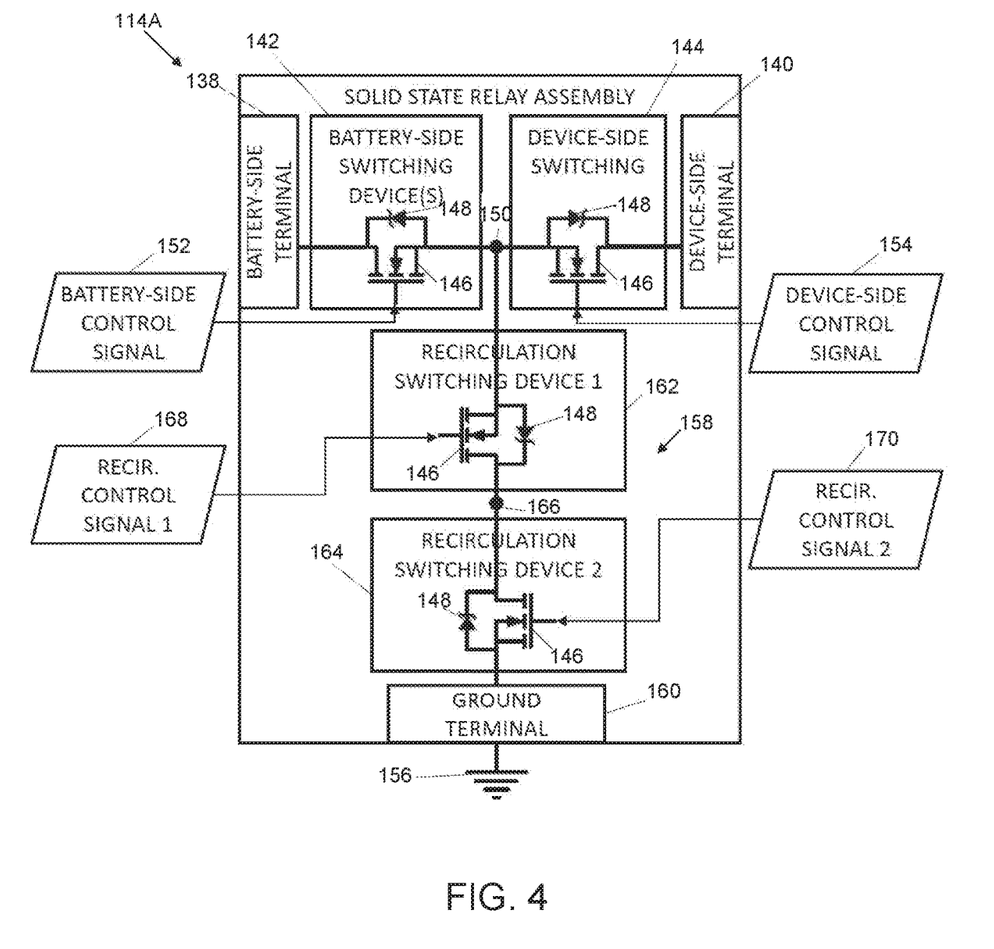
FIG. 4 is a view of a solid state relay assembly for use with a battery system, according to various embodiments.

In some embodiments, one or more of the switching devices 134 may be implemented using semiconductor switching devices 134, for example, to facilitate controlling flow (e.g., direction and/or presence) of electrical power between the battery 112 and the electrical devices 116. To help illustrate, an example of a solid-state relay assembly 114A implemented using semiconductor switching devices 134 is shown in FIG. 4. As in depicted example, the solid-state relay assembly 114A may include a battery-side terminal 138 and a device-side terminal 140.

Additionally, as in the depicted example, the solid-state relay assembly 114A may include one or more battery-side switching devices 142 electrically coupled to the battery-side terminal 138. Furthermore, as in the depicted example, the solid-state relay assembly 114A may include one or more device-side switching devices 144 electrically coupled to the device-side terminal 140. As described above, the switching devices 134 in the solid-state relay assembly 114A may be implemented using semiconductor switching devices 134.

To help streamline discussion, the present disclosure describes examples implemented using metal-oxide-semiconductor field-effect transistors (MOSFETs) 146, which each include an intrinsic body diode 148. For example, a battery-side switching device 142 may include a metal-oxide-semiconductor field-effect transistor 146 implemented such that its drain is coupled to the battery-side terminal 138. Additionally, a device-side switching device 44 may include a metal-oxide-semiconductor field-effect transistor 146 implemented such that its drain is coupled to the device-side terminal 140. In other words, as in the depicted example, the battery-side switching device 142 and the device-side switching device 144 may be electrically coupled at a first (e.g., common source) node 150. However, it should be appreciated that the depicted example is merely intended to be illustrative and not limiting. In particular, it should be appreciated that the techniques described in the present disclosure may implemented using and/or adapted for use with other types of semiconductor switching devices 134.

In any case, to facilitate controlling operation of the solid-state relay assembly 114A, control signals (e.g., output from the control system 18) may be supplied to the semiconductor switching devices 134. For example, a battery-side control signal 152 may be supplied to a control input (e.g., gate) of a battery-side switching device 142 to selectively activate the battery-side switching device 142. Additionally, a device-side control signal 154 may be supplied to a control input (e.g., gate) of a device-side switching device 144 to selectively activate the device-side switching device 144.

In some embodiments, implementing a solid-state relay assembly 114 in this manner may enable the solid-state relay assembly 114 to selectively provide a disconnected (e.g., open) state as well as multiple connected (e.g., closed) states, which facilitate controlling (e.g., limiting) direction and/or presence of electrical power flowing between the battery-side terminal 138 and the device-side terminal 140 and, thus, between the battery cells 122 and the electrical devices 116. For example, the solid-state relay assembly 114A may implement a first (e.g., charging only) connected state by switching and/or maintaining the device-side switching device 144 in an activated (e.g., connected or closed) state while switching and/or maintaining the battery-side switching device 142 in a deactivated (e.g., disconnected or open) state. Additionally, the solid-state relay assembly 114A may implement a second (e.g., discharging only) connected state by switching and/or maintaining the battery-side switching device 142 in the activated state while switching and/or maintaining the device-side switching device 144 in the deactivated state. Furthermore, the solid-state relay assembly 114A may implement a third (e.g., bi-directional) connected state by switching and/or maintaining both the battery-side switching device 142 and the device-side switching device 144 in the activated state.

On the other hand, the solid-state relay assembly 114A may implement a disconnected state by switching and/or maintaining both the battery-side switching device 142 and the device-side switching device 144 in the deactivated state. As such, in the disconnected state, the solid-state relay assembly 114A may block electrical power from flowing between the battery-side terminal 138 and the device-side terminal 140 and, thus, block electrical power from flowing between the battery cells 122 and the electrical devices 16. However, electrically conductive material generally has some amount of inductance, which resists changes in electrical current flowing therethrough.

In other words, the inductance present in a battery system 110 (e.g., an electrical device 116 and/or a device-side electrical bus 126) may result in electrical current continuing to flow for some duration after the solid-state relay assembly 114A is switched from a connected state to the disconnected state. In fact, in some instances, the inductance may pull the device-side electrical bus 126 to a negative voltage relative to the system ground 156 in an effort to continue the current flow. Even with the device-side switching device 144 coupled therebetween in the deactivated state, in such instances, the device-side electrical bus 126 may nevertheless pull the voltage at the first (e.g., common source) node 150 negative relative to a system ground 156 due to the first node 150 remaining electrically connected to the device-side electrical bus 126, for example, via the intrinsic body diode 148 of the device-side switching device 144.

Unfortunately, at least in some instances, likelihood of a negative voltage at the first (e.g., common source) node 150 affecting (e.g., damaging) other components in a battery system 10, 110 may increase as magnitude of the negative voltage increases. For example, as magnitude of the negative voltage at the first node 50 increases, the voltage drop across a battery-side switching device 142 coupled between the battery cells 122 and the first node 150 may increase. In fact, at least in some instances, the negative voltage at the first node 150 may result in a voltage drop across the battery-side switching device 142 that causes its intrinsic body diode 148 to breakdown or avalanche, thereby affecting (e.g., reduce) operational reliability of a solid-state relay assembly 114 and, thus, a battery system 10 in which the solid-state relay assembly 114 is deployed.

Accordingly, to facilitate improving operational reliability, the present disclosure provides techniques for implementing and/or operating a recirculation path 158 electrically coupled between a first (e.g., common source) node 150 in a solid-state relay assembly 114 and a system ground 156. As in the example depicted in FIG. 4, in some embodiments, the recirculation path 158 may be implemented in the solid-state relay assembly 114A, for example, within a housing of the solid-state relay assembly 114A. Thus, in such embodiments, the solid-state relay assembly 114A may include a ground terminal 160, which electrically couples the recirculation path 158 to the system ground 156. In other embodiments, the recirculation path 158 may be implemented external from the solid-state relay assembly 114A, for example, as a separate (e.g., distinct or discrete) device or component coupled to the solid-state relay assembly 114A.

In any case, as in the depicted example, the recirculation path 158 may include a first recirculation switching device 162 and a second recirculation switching device 164. As described above, the solid-state relay assembly 114A may be implemented using semiconductor switching devices 134. For example, the first recirculation switching device 162 may include a metal-oxide-semiconductor field-effect transistor 146 implemented such that its source is coupled to the first (e.g., common source) node 150. Additionally, the second recirculation switching device 164 may include a metal-oxide-semiconductor field-effect transistor 146 implemented such that its source is coupled to the system ground 156, for example, via the ground terminal 160. In other words, as in the depicted example, the first recirculation switching device 162 and the second recirculation switching device 164 may be electrically coupled at a second (e.g., common drain) node 166. While a first recirculation switching device and a second recirculation switching device are shown, it should be understood each recirculation switching devices may in turn comprise multiple recirculation switching devices. In other words, the first recirculation switching device 162 may comprise a first, second, and third first recirculation switching device. In turn, the second recirculation switching device 164 may comprise multiple second recirculation switching devices—for example, a first, second, and third second recirculation switching device.

To facilitate controlling operation of the recirculation path 158, control signals (e.g., output from the control system 118) may be supplied to the first recirculation switching device 162 and the second recirculation switching device 164. For example, a first (e.g., reverse voltage protection) recirculation control signal 168 may be supplied to a control input (e.g., gate) of the first recirculation switching device 162 to selectively activate the first recirculation switching device 162. Additionally, a second (e.g., inadvertent short-circuit protection) recirculation control signal 170 may be supplied to a control input (e.g., gate) of the second recirculation switching device 164 to selectively activate the second recirculation switching device 164.

In some embodiments, the first recirculation switching device 162 may be implemented to protect one or more upstream components including the second recirculation switching device 164 from reverse voltage on a device-side electrical bus 126, for example, by blocking electrical current produced by the reverse voltage from flowing through the intrinsic body diode 148 of the second recirculation switching device 164. Thus, in such embodiments, the first recirculation switching device 162 may generally be in the deactivated (e.g., open) state when the solid-state relay assembly 114A is in a connected state, but switch to and/or maintain the activated (e.g., closed) state immediately before the solid-state relay assembly 114A switches from the connected state to the disconnected state. Additionally, in some embodiments, the second recirculation switching device 164 may be implemented to protect against the recirculation path 158 inadvertently producing a short-circuit to the system ground 156. Thus, in such embodiments, the second recirculation switching device 164 may generally be in the deactivated state when the solid-state relay assembly 114A is in a connected state and switch to and/or maintain the activated state immediately after the solid-state relay assembly 114A switches from the connected state to the disconnected state.

When the first recirculation switching device 162 and the second recirculation switching device 164 are both in the activated state, the recirculation path 158 may electrically connect the first (e.g., common source node) 150 of the solid-state relay assembly 114A to the system ground 156. In other words, the electrical current that the inductance of the device-side electrical bus 126 and/or the electrical devices 116 causes to continue to flow even after the solid-state relay assembly 114A is switched to the disconnected state may recirculate from the system ground 156 to the first node 150 via the recirculation path 158 and back to the electrical devices 116 via the intrinsic body diode 148 of a device-side switching device 144. In this manner, the recirculation path 158 may reduce magnitude of the voltage drop across a battery-side switching device 142, for example, by holding voltage at the first 150 approximately (e.g., substantially) at the system ground 156. As described above, at least in some instance, this may facilitate improving operational reliability of a solid-state relay assembly 114 and, thus, a battery system 110, 10 in which the solid-state relay assembly 114 is implemented, for example, by reducing likelihood of voltage drop across a battery-side switching device 142 causing its intrinsic body diode 148 to breakdown or avalanche.

Figure 5:
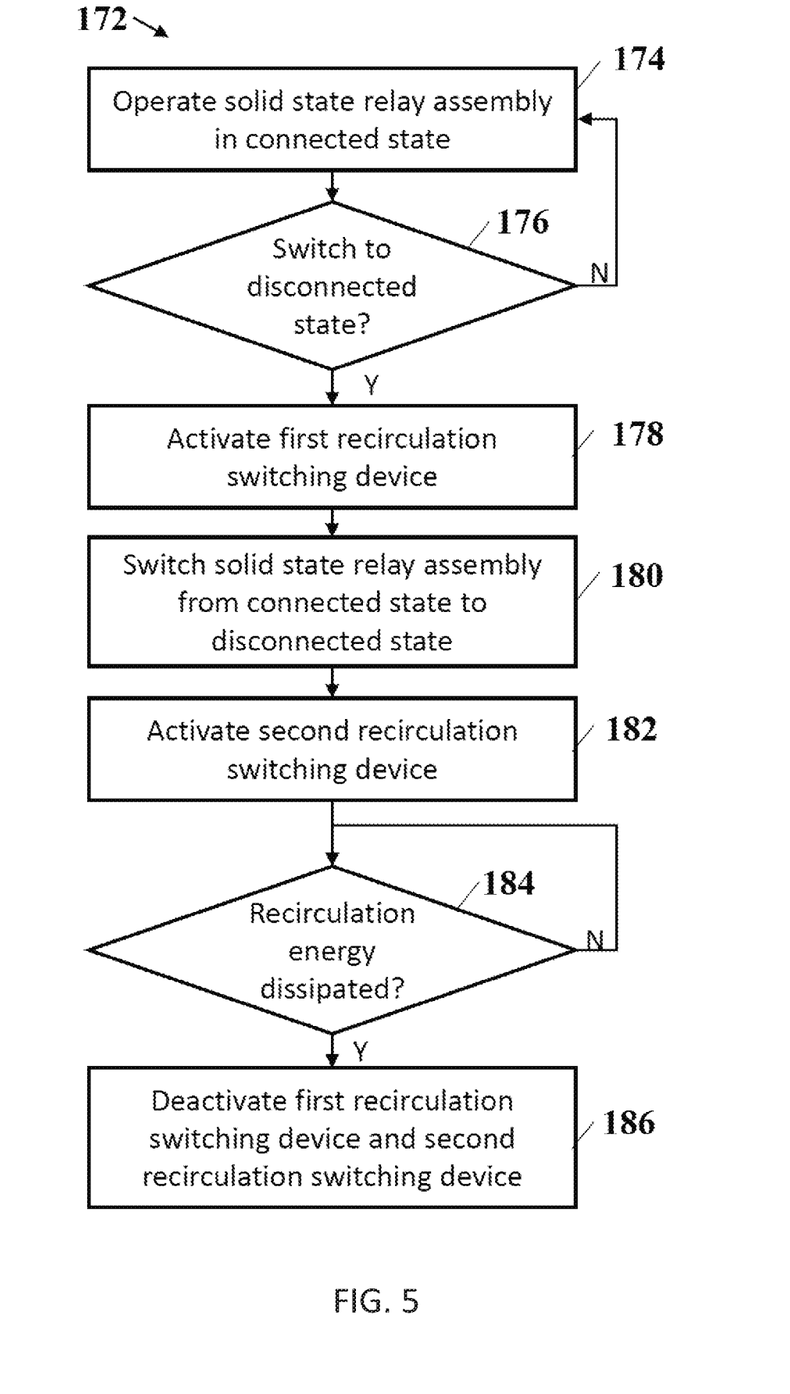
FIG. 5 is a workflow for operation of a solid state relay assembly for use with a battery system, according to various embodiments.

An example of a process 172 for operating a battery system 110 including a solid-state relay assembly 114 is described in FIG. 5. Generally, the process 172 includes operating a solid-state relay assembly in a connected state (process block 174) and determining whether it is desired to switch the solid-state relay assembly from the connected state to a disconnected state (decision block 176). Additionally, when it is desired to switch to the disconnected state, the process 172 includes activating a first recirculation switching device (process block 178), switching the solid-state relay assembly from the connected state to the disconnected state (process block 180), activating a second recirculation switching device (process block 182), determining whether recirculation energy has been dissipated (decision block 184), and deactivating the first recirculation switching device and the second recirculation switching device after the recirculation energy has been dissipated (process block 186).

In some embodiments, the process 172 may be implemented at least in part based on circuit connections implemented (e.g., programmed) in a control system 118. Additionally or alternatively, the process 172 may be implemented at least in part by executing instructions stored in a tangible, non-transitory, computer-readable medium, such as memory in the control system 118, using processing circuitry, such as one or more processors in the control system 118.

Figure 6:
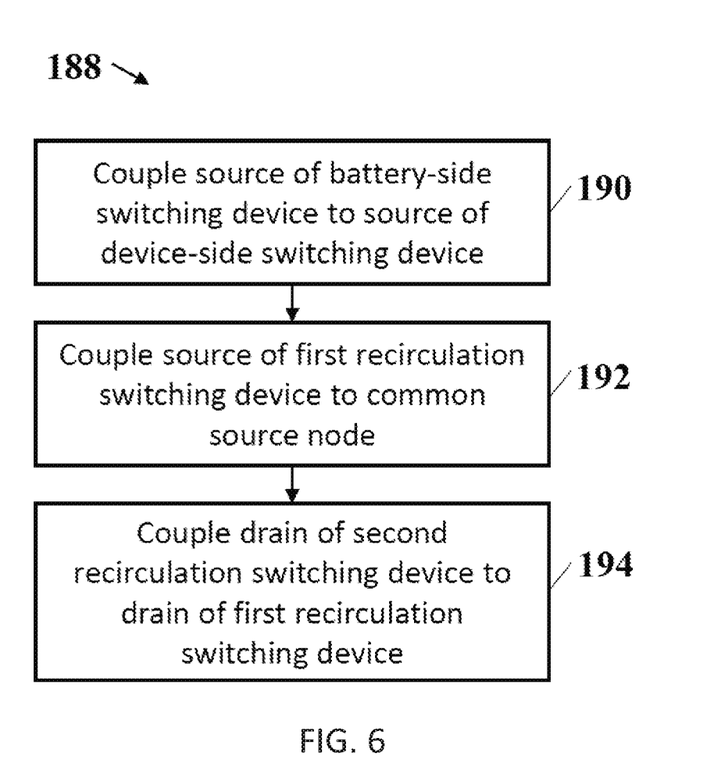
FIG. 6 is a second workflow for operation of a solid state relay assembly for use with a battery system, according to various embodiments.

An example of a process 188 for implementing a solid-state relay assembly 114 with a recirculation path 158 is described in FIG. 6. Generally, the process 188 includes coupling a source of a battery-side switching device to a source of a device-side switching device (process block 190), coupling a source of a first recirculation switching device to a common source node (process block 192), and coupling a drain of a second recirculation switching device to a drain of the first recirculation switching device (process block 194). In some embodiments, the process 188 may be implemented at least in part by a manufacturer of the solid-state relay assembly 114 and/or a system integrator of a battery system 110 in which the solid-state relay assembly 114 is deployed.

Figure 7:
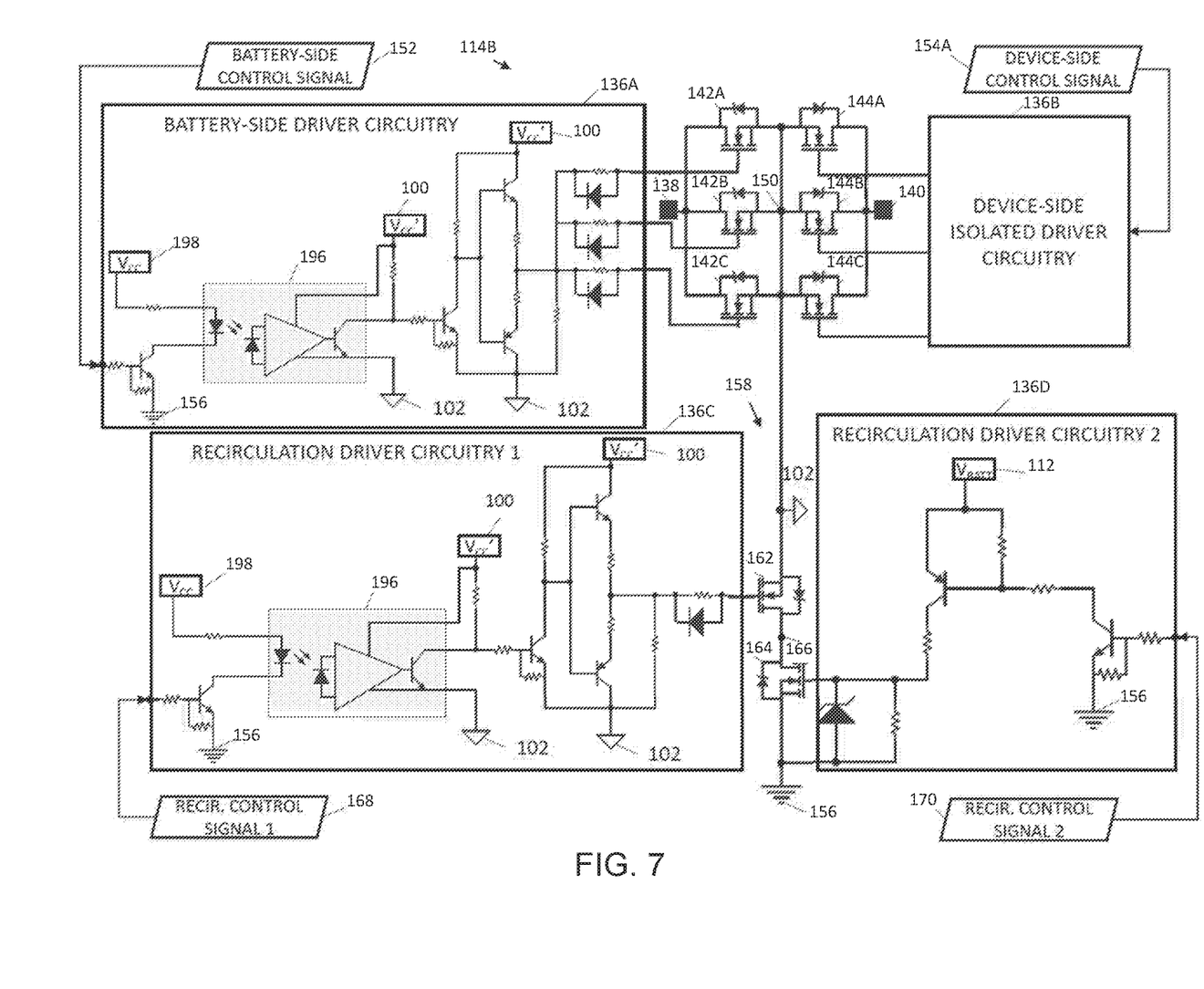
FIG. 7 is a detailed view of a solid state relay assembly for use with a battery system, according to various embodiments.

Another example of a solid-state relay assembly 114B is shown in FIG. 7. As depicted, the solid-state relay assembly 114B includes three battery-side switching devices 142—namely a first battery-side switching device 142A, a second battery-side switching device 142B, and a third battery-side switching device 142C. While three battery-side switching devices are shown, this number should be understood as non-limiting. In various embodiments, the number of battery-side switching devices could be one, two, four, five, six, etc. Additionally, as depicted the solid-state relay assembly 114B includes three device-side switching devices 144—namely a first device-side switching device 144A, a second device-side switching device 144B, and a third device-side switching device 144C. While three device-side switching devices are shown, this number should be understood as non-limiting. In various embodiments, the number of device-side switching devices could be one, two, four, five, six, etc.

Furthermore, as depicted, the solid-state relay assembly 114B includes driver circuitry 136. In particular, the solid-state relay assembly 114B includes battery-side driver circuitry 136A electrically coupled to control inputs (e.g., gates) of the battery-side switching devices 142, device-side driver circuitry 136B electrically coupled to control inputs of the device-side switching devices 144, first recirculation driver circuitry 136C electrically coupled to a control input of the first recirculation switching device 162, and second recirculation driver circuitry 136D electrically coupled to a control input of the second recirculation switching device 164. It should be understood device-side driver circuitry 136B may, in various embodiments, have mirror circuitry (in other words, the same components) as battery-side driver circuitry 136A.

In some embodiments, at least a portion of the driver circuitry 136 may be electrically isolated, for example, to reduce the likelihood of recirculating electrical current flowing through the driver circuitry 136 instead of the recirculation path 158. To facilitate providing electrical isolation, as in the depicted example, one or more optocouplers 196 may be implemented in the driver circuitry 36. Additionally, as in the depicted example, an input-side of an optocoupler 196 may receive an input signal generated based at least in part on an input control signal (e.g., received from a control system 118) relative to a power supply voltage 198 and the system ground 156. Furthermore, as in the depicted example, the output-side of the optocoupler 196 may output an isolated signal generated based at least in part on the input signal relative to an isolated power supply voltage 100 and an isolated ground 102.

In some embodiments, the isolated ground 102 may be coupled to the first (e.g., common source) node 150 of a solid-state relay assembly 114. In other words, at least in some instances, the isolated ground 102 may differ from system ground 156, for example, when the first recirculation switching device 162 and the second recirculation switching device 164 are both in the deactivated state and the solid-state relay assembly 114 is in a connected state. Additionally, in some embodiments, the isolated power supply voltage 100 may be generated by passing the power supply voltage 198 through one or more transformers.

The disclosed system and method may have various advantages. For example, the disclosed system and method may prevent damage to electronic components in the battery system. As a non-limiting example, the disclosed system and method may route current in the event of a reverse-cycle of power in the battery system. In various embodiments, the system and method may allow for protection of circuit components when there is overflow current or when the battery is otherwise turned off. This also may allow for various advantages to system safety.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that references to relative positions (e.g., "top" and "bottom") in this description are merely used to identify various elements as are oriented in the Figures. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the system, methods, and devices as shown in the various examples of embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements show as multiple parts may be integrally formed, the operation of the interfaces may be reversed or otherwise varied, the length or width of the structures and/or members or connector or other elements of the system may be varied, the nature or number of adjustment positions provided between the elements may be varied (e.g. by variations in the number of engagement slots or size of the engagement slots or type of engagement). The order or sequence of any process or method steps may be varied or re-sequenced according to alternative embodiments. Other substitutions, modifications, changes and omissions may be made in the design, operating conditions and arrangement of the various examples of embodiments without departing from the spirit or scope of the present inventions.

While this invention has been described in conjunction with the examples of embodiments outlined above, various alternatives, modifications, variations, improvements and/or substantial equivalents, whether known or that are or may be presently foreseen, may become apparent to those having at least ordinary skill in the art. Accordingly, the examples of embodiments of the invention, as set forth above, are intended to be illustrative, not limiting. Various changes may be made without departing from the spirit or scope of the invention. Therefore, the invention is intended to embrace all known or earlier developed alternatives, modifications, variations, improvements and/or substantial equivalents.

The technical effects and technical problems in the specification are exemplary and are not limiting. It should be noted that the embodiments described in the specification may have other technical effects and can solve other technical problems.

The invention claimed is:

1. A battery system comprising:
   a battery;
   a solid-state relay system; and
   a control system;
   wherein the solid-state relay system comprises a first battery-side switching device, a first device-side switching device, and a recirculation path;
   wherein the solid-state relay system further comprises a second battery-side switching device and a third battery-side switching device, and a second device-side switching device and a third device-side switching device;
   wherein the recirculation path comprises a first recirculation switching device;
   wherein the recirculation path further comprises a second recirculation switching device; and
   wherein the first recirculation switching device connects to a first recirculation driver circuitry and the second recirculation device connects to a second recirculation driver circuitry.

2. The battery of claim 1, wherein the first recirculation switching device comprises a metal-oxide semiconductor field-effect transistor.

3. The battery system of claim 1, wherein both the first recirculation switching device and the second recirculation switching device each comprise a metal-oxide semiconductor field-effect transistor.

4. The battery of claim 1, wherein each of the first battery-side switching device, the second battery-side switching device, the third battery-side switching device, the first device-side switching device, the second device-side switching device and the third device-side switching device each comprise a metal-oxide semiconductor field-effect transistor.

5. A solid-state relay assembly for a battery system comprising:
   a device-side driver circuitry having a device-side switching device;
   a battery-side driver circuitry having a batter-side switching device:
   a first recirculation driver circuitry;
   a first recirculation switching device;
   a second recirculation switching device;
   a second recirculation driver circuitry; and
   wherein the device-side switching device comprises a first device-side switching device, a second device-side switching device, and a third device-side switching device.

6. The solid-state relay assembly of claim 5, wherein the first recirculation switching device, the second recirculation switching device, or both the first recirculation switching device and the second recirculation switching device each comprise a metal-oxide semiconductor field-effect transistor.

7. The solid-state relay assembly of claim 5, wherein the battery-side switching device comprises a first battery-side switching device, a second battery-side switching device, and a third battery-side switching device.

8. The solid-state relay assembly of claim 5, wherein each of the first device-side switching device. the second device-side switching device and the third device-side switching device each comprise a metal-oxide semiconductor field-effect transistor.

9. The solid-state relay assembly of claim 5, wherein the battery-side switching device is a metal-oxide semiconductor field-effect transistor.

* * * * *